United States Patent [19]

Massaron

[11] Patent Number: 5,237,203
[45] Date of Patent: Aug. 17, 1993

[54] MULTILAYER OVERLAY INTERCONNECT FOR HIGH-DENSITY PACKAGING OF CIRCUIT ELEMENTS

[75] Inventor: Laurence I. Massaron, Santa Monica, Calif.

[73] Assignee: TRW Inc., Redondo Beach, Calif.

[21] Appl. No.: 893,617

[22] Filed: Jun. 5, 1992

Related U.S. Application Data

[63] Continuation-in-part of Ser. No. 695,065, May 3, 1991, abandoned.

[51] Int. Cl.⁵ ............................................ H01L 23/16
[52] U.S. Cl. .................................... 257/688; 257/690; 257/719; 257/727; 257/773; 257/759; 257/785
[58] Field of Search ............... 257/688, 690, 719, 727, 257/759, 773, 785

[56] References Cited

U.S. PATENT DOCUMENTS 4,721,995  1/1988  Tanizawa ............................... 357/75
5,029,325  7/1991  Higgins et al. ......................... 357/75

Primary Examiner—Edward Wojciechowicz
Attorney, Agent, or Firm—Ronald L. Taylor

[57] ABSTRACT

A multilayer overlay interconnect for packaging various circuit elements such as integrated-circuit (IC) chips in high-density configurations. The overlay interconnect allows multiple IC chips to be removably mounted and electrically interconnected within a chip package with minimized interconnection lengths between the IC chips, for improved high speed operation of the chips. In addition, the back side of the chips remain accessible for making direct contact with a heat sink and/or a substrate interconnect which provides for good heat dissipation and/or additional electrical contact areas. The multilayer overlay interconnect is either flexible or both flexible and compressible. The overlay interconnect includes a plurality of thin polymer layers, a plurality of inner contact areas on an outermost layer for making electrical contact with contact areas on the IC chips, a plurality of outer contact areas on the outermost layer for making electrical contact with contact areas on leads extending into the chip package, and electrically-conductive traces on one or more of the layers, with interconnecting vias, for interconnecting the inner and outer contact areas. The overlay interconnect further includes cut-out regions to accommodate for substantial variations in circuit element thicknesses or circuit elements which require a medium of air to operate properly.

32 Claims, 3 Drawing Sheets

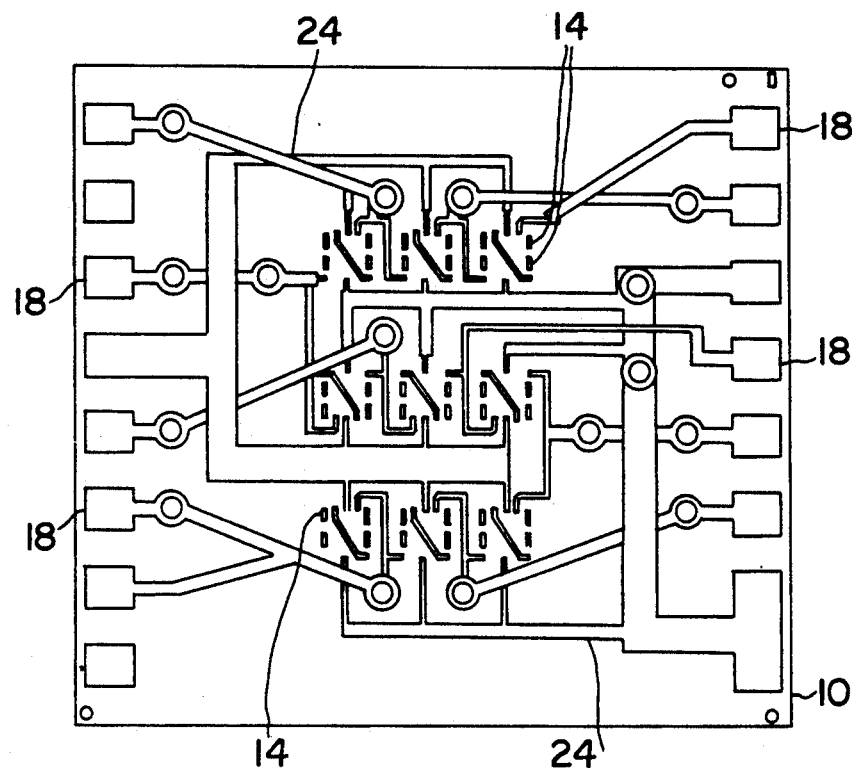
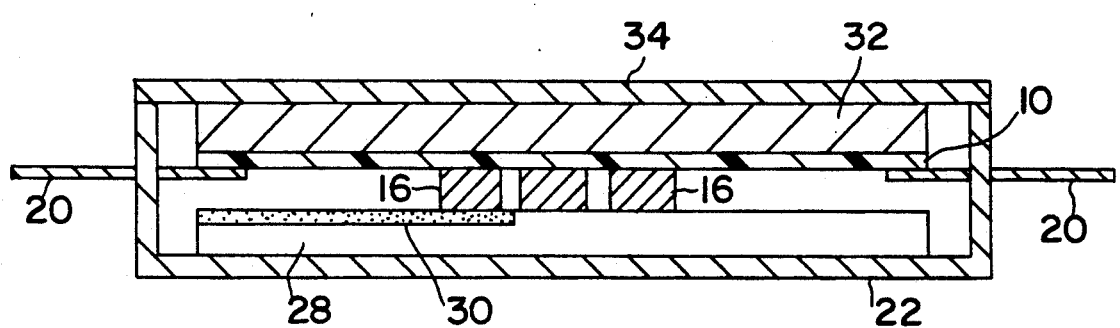
FIG.1
FIG.2

MULTILAYER OVERLAY INTERCONNECT FOR HIGH-DENSITY PACKAGING OF CIRCUIT ELEMENTS

CROSS REFERENCE TO RELATED APPLICATIONS

This application is a continuation-in-part application of commonly assigned U.S. Ser. No. 07/695,065, now abandoned entitled "Flexible Multi-Layer Overlay Interconnect For High Density Packaging Of Integrated Circuit Chips" by Laurence I. Massaron, filed May 3, 1991.

BACKGROUND OF THE INVENTION

This invention relates generally to techniques for packaging circuit elements and, more particularly, to techniques for packaging multiple integrated-circuit (IC) chips in high-density configurations.

A wide variety of techniques are available for packaging various circuit elements, including integrated-circuit (IC) chips. One conventional IC chip packaging technique employs a dual-inline (DIP) package or a leadless or a leaded chip carrier for packaging a single IC chip. Contact areas located around the periphery of the IC chip are connected to leads or pins located around the periphery of the chip package by bonding extremely fine wires between the contact areas and the leads or pins. The DIP package or chip carrier is then connected to a circuit board by the pins or by soldering.

Another conventional IC chip packaging technique is tape-automated bonding. Tape-automated bonding utilizes patterned conductors on a polymer tape for interconnecting an IC chip with a substrate or circuit board. As an example, a two-layer tape can be fabricated by depositing a metal layer onto a polymer film. The metal layer is then photolithographically patterned and etched to form a patterned conductor layer. The polymer film is also photolithographically patterned and etched to provide bonding windows for both inner and outer leads. The inner leads extend into an inner window and are bonded to the IC chip contact areas, while the outer leads extend outward from the tape and are bonded to contact areas on the substrate or circuit board. The inner and outer leads are bonded to the contact areas using a conventional bonding technique, such as thermocompression bonding, ultrasonic bonding or laser spot welding. The exposed surface of the IC chip is usually encapsulated with a silicone or epoxy material after the inner leads are bonded to the IC chip. The two-layer tape can also be fabricated by spraying a polymer layer onto a metal foil rather than by depositing a metal layer onto a polymer film. A three-layer tape can be fabricated by gluing a metal foil to a pre-punched polymer film.

However, these two packaging techniques result in chip to chip interconnect lengths that greatly exceed the chip size. Consequently, interconnect delay times tend to dominate chip delay times, thus limiting the maximum operating frequencies of the chips. Interconnection lengths are important at frequencies above about 50MHz, since wiring must be treated as resistive transmission lines, which causes delays that are proportional to the square of the distance between the chips. In addition, the large circuit spread necessitated by the individual chip packages and low wiring density require large chip output drivers, which consume a large fraction of the system power.

One technique for packaging multiple IC chips in high-density configurations is flip-chip bonding. Flip-chip bonding is a packaging technique in which the IC chips are inverted and bonded face down to substrate interconnection patterns. Raised metallic bumps of solder are typically formed on the chip contact areas, which, through reflow soldering, bond the chip contact areas to their corresponding contact areas on the substrate patterns. Although flip-chip bonding does provide high-density packaging of IC chips, this technique limits heat dissipation, since the chip is not in direct contact with the substrate, and precludes visual inspection of the soldered connections.

Another technique for packaging multiple IC chips in high-density configurations has been developed by General Electric Corporation and is disclosed in a paper by Levinson, L.M. et al. entitled "High-Density Interconnects Using Laser Lithography." This packaging technique employs a high-density interconnect for packaging the chips. The high-density interconnect is fabricated by bonding a thin flexible polymer film to one or more IC chips mounted on a substrate in a chip package. Via holes are then laser drilled down through the polymer film to the chip contact areas. A metal layer is deposited on the polymer film to fill the vias holes and make electrical contact with the chip contact areas. The metal layer is then photolithographically patterned and etched to form a patterned conductor layer. Successive layers are built up by spraying or spinning on additional polymer layers and depositing additional metal layers which are subsequently photolithographically patterned and etched to form patterned conductor layers. Additional via holes are drilled and filled with metal to make electrical connections between the layers. Contact areas are formed on the uppermost layer and wire bonded to the package leads.

Although the GE high-density interconnect does provide high-density packaging of IC chips, it has several disadvantages. One disadvantage is that the interconnect is not suitable for testing IC chips, since it is not easily removed if one or more of the chips are found defective and must be replaced. Another disadvantage is that the interconnect is formed in the chip package, thus subjecting the IC chips to the fabrication process and requiring customization of the interconnect for any deviations in the locations of the chip contact areas. Accordingly, there is a need for a high-density packaging technique that does not suffer from these limitations. The present invention clearly fulfills this need.

SUMMARY OF THE INVENTION

The present invention resides in a multilayer overlay interconnect which is either flexible or both flexible and compressible for packaging various circuit elements such as integrated-circuit (IC) chips in high-density configurations. The overlay interconnect allows multiple IC chips to be removably mounted and electrically interconnected within a chip package with minimized interconnection lengths between the IC chips, for improved high speed operation of the chips. The overlay interconnect further allows high-density packaging of circuit elements with substantial variations in thickness or which require a medium of air to operate properly, by providing cut-out regions in the overlay interconnect. In addition, the back side of the circuit elements remain accessible for making direct contact with a heat sink and/or a substrate interconnect which provides for good heat dissipation and/or additional electrical contact areas.

The multilayer overlay interconnect includes a plurality of thin polymer layers which are either flexible or both flexible and compressible, a plurality of inner contact areas on an outermost layer for making electrical contact with contact areas on the IC chips, a plurality of outer contact areas on the outermost layer for making electrical contact with contact areas on leads extending into the chip package, and electrically-conductive traces on one or more of the layers, with interconnecting vias, for interconnecting the inner and outer contact layers. The IC chips are closely spaced and mounted on a heat sink and/or a substrate interconnect which provides for good heat dissipation and/or additional electrical contact areas.

An elastomer layer, such as silicone, is employed to compress the flexible overlay interconnect together with the IC chips and leads when the chip package is sealed, thus making good electrical contact between the various contact areas. The flexible and compressible overlay interconnect may employ the elastomer layer to compress the overlay interconnect together with the IC chips and leads to make electrical contact between the various contact areas. However, since the flexible and compressible overlay interconnect is both flexible and compressible, the elastomer layer is not required.

The IC chips can be placed almost edge to edge for significantly increased density, thus minimizing chip-to-chip interconnect lengths and, therefore, interconnect delays, power losses and crosstalk. The overlay interconnect is particularly useful for testing IC chips, even while still in wafer form. If a defective chip is identified in a circuit test, the overlay interconnect can be removed, the defective chip removed and replaced, and the overlay interconnect replaced, without damage to the other IC chips. The overlay interconnect can also be applied to a single chip in a socketable, single chip package for testing and burn-in and then removed. If desired, the contact areas can be bonded together after testing by a conventional bonding technique, such as thermocompression bonding, ultrasonic bonding or laser spot welding.

The multilayer overlay interconnect of the present invention is fabricated by applying a metal layer by sputtering or other conventional vacuum deposition methods onto a polymer film to form a base layer. Conventional photolithographic techniques are then used to pattern and etch the metal layer to form electrically-conductive traces. A second polymer layer is then formed on the base layer by spraying or spinning on a liquid polymer. After the second polymer layer has cured, via holes are opened down through the polymer layer to one or more of the traces. A second metal layer is then deposited onto the second polymer layer, with the metal filling the via holes to form interconnecting vias. The second metal layer is then photolithographically patterned and etched to form additional traces.

Successive layers are built up by spraying or spinning on additional polymer layers and depositing additional metal layers which are subsequently photolithographically patterned and etched. As many as ten or more layers may be formed, depending on the complexity of the interconnect. The inner and outer contact areas are then formed along with the electrically-conductive traces on the outermost layer. Bumps can be formed on the contact areas to ensure good electrical connections between the various contact areas. In an alternative fabrication method of the present invention, the additional polymer layers are built up by gluing a polymer film to the previous layer rather than by spinning or spraying on a liquid polymer. Thereafter, cut-out regions are opened down through the overlay interconnect, where required, to accommodate for substantial variations in circuit element thicknesses or for circuit elements which require a medium of air to operate properly.

It will be appreciated from the foregoing that the present invention represents a significant advance in the field of high-density circuit element packaging. Other features and advantages of the present invention will become apparent from the following more detailed description, taken in conjunction with the accompanying drawings, which illustrate, by way of example, the principles of the invention.

BRIEF DESCRIPTION OF THE DRAWINGS

FIG. 1 is a plane view of one preferred embodiment of a multilayer overlay interconnect of the present invention;

FIG. 2 is a cross sectional side view of a chip packaging construction using the multilayer overlay interconnect of FIG. 1;

DETAILED DESCRIPTION OF THE PREFERRED EMBODIMENTS

Figure 2A:
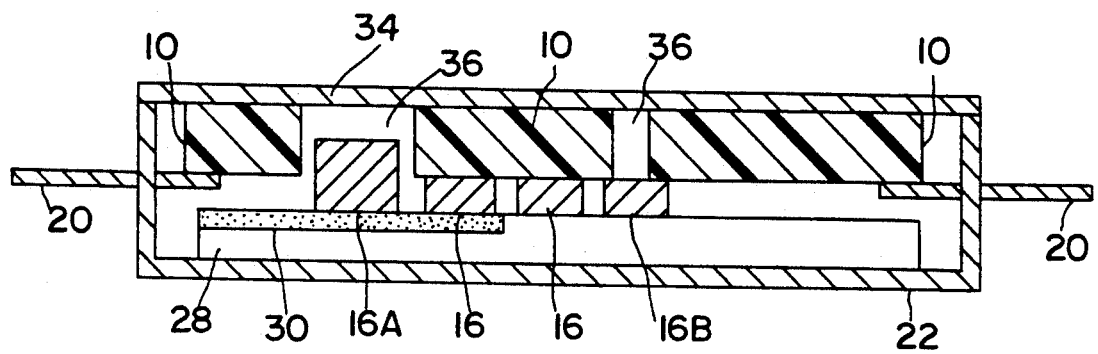
FIG. 2A is a cross sectional side view of a chip packaging construction using another preferred embodiment of a multilayer overlay interconnect, including cut-out regions.

As shown in the drawings for purposes of illustration, the present invention is embodied in a multilayer overlay interconnect which is either flexible or both flexible and compressible. By way of a non-limiting example, the multilayer overlay interconnect can be employed to package multiple integrated-circuit (IC) chips in high-density configurations. However, one skilled in the art would find it apparent that the overlay interconnect can be employed to package various other circuit elements such as chip resistors, chip capacitors, optical waveguides, diodes, etc., or any combination thereof. The overlay interconnect allows multiple IC chips to be removably mounted and electrically interconnected within a chip package with minimized interconnection lengths between the IC chips, for improved high speed operation of the chips. The overlay interconnect further allows high-density packaging of circuit elements with substantial variations in thicknesses or which require a medium of air to operate properly, by providing cut-out regions in the overlay interconnect. In addition, the back side of the circuit elements remain accessible for making direct contact with a heat sink and/or a substrate interconnect which provides for good heat dissipation and/or additional electrical contact areas.

Figure 2B:
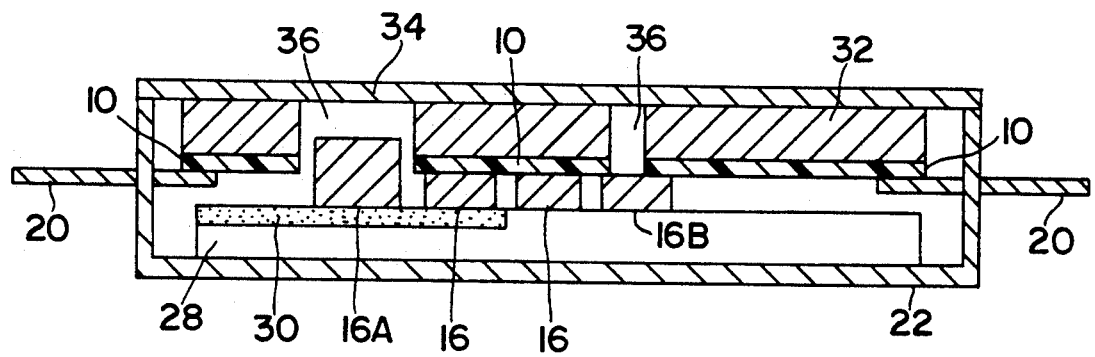
FIG. 2B is a cross sectional side view of a chip packaging construction of FIG. 2, including cut-out regions.
Figure 3A:
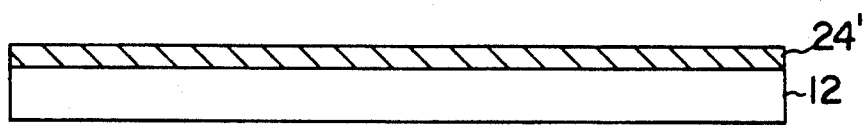
FIG. 3a-3f is a series of cross sectional views showing the fabrication process of the multilayer overlay interconnect of the present invention.
Figure 3B:
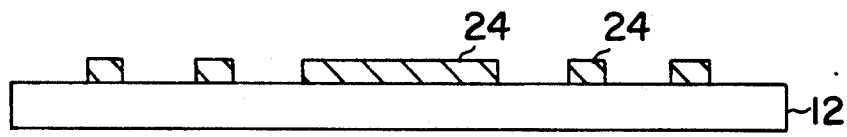
Figure 3C:
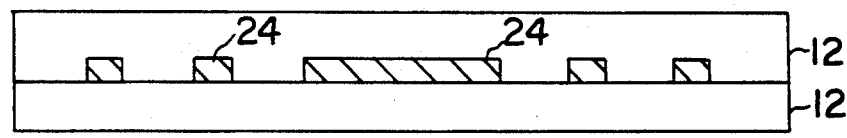
Figure 3D:
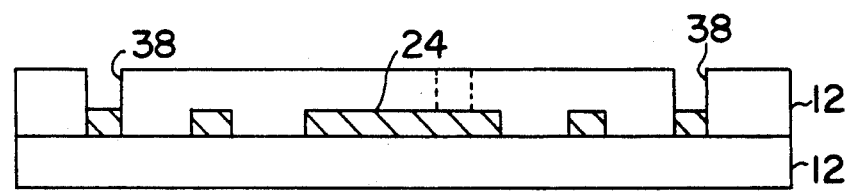
Figure 3E:
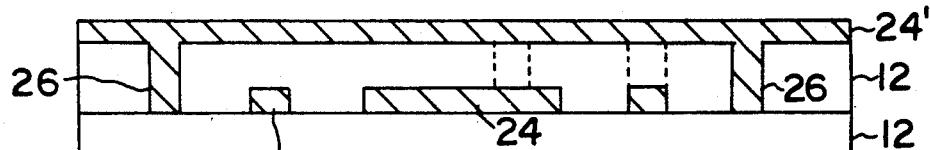
Figure 3F:
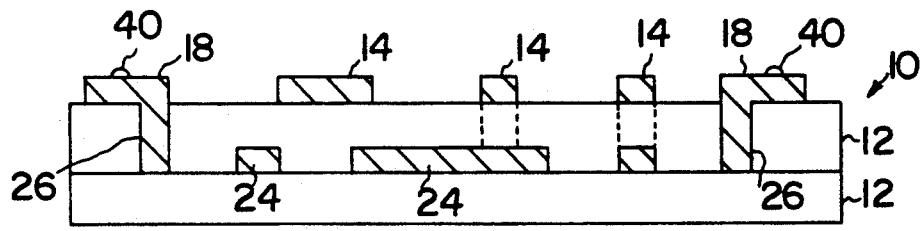

In accordance with one preferred embodiment of the present invention, as illustrated in FIGS. 1, 2 and 3f, a multilayer overlay interconnect 10 includes a plurality of thin polymer layers 12, a plurality of inner contact areas 14 on an outermost layer 12 for making electrical contact with contact areas on an array of IC chips 16, a plurality of outer contact areas 18 on the outermost layer 12 for making electrical contact with contact areas on leads 20 extending into a chip package 22, and electrically-conductive traces 24 on one or more of the layers 12, with interconnecting vias 26, for interconnecting the inner and outer contact areas 14 and 18. The IC chips 16 are closely spaced and mounted on a heat sink 28 which allows for good heat dissipation and/or a substrate interconnect 30 which provides additional electrical contact areas.

An elastomer layer 32, such as silicone, is used to compress the one preferred overlay interconnect 10 which is only flexible together with the array of IC chips 16 and leads 20 when the chip package 22 is sealed by a lid 34, thus making good electrical contact between the various contact areas. The other preferred overlay interconnect 10 which is both flexible and compressible, may be used with or without the elastomer layer 32 to compress together the IC chips 16 and leads 20 when the chip package 22 is sealed by the lid 34, as shown clearly in FIG. 2A. In this later configuration, the overlay interconnect 10 has an increased thickness to compensate for the absence of the elastomer layer 32.

The IC chips 16 can be placed almost edge to edge for significantly increased density, thus minimizing chip-to-chip interconnect lengths and, therefore, interconnect delays, power losses and crosstalk. Typically, the top chip-to-chip surfaces of the IC chips 16 are fairly even, but any variations are easily accommodated by the overlay interconnect 10, since the interconnect 10 is either flexible or both flexible and compressible. The flexible overlay interconnect 10, along with the elastomer layer 32, as shown in FIG. 2, offers a means to provide a distributed pressure between the various contact areas, while the flexible and compressible overlay interconnect 10, as shown in FIG. 2A, offers a built-in means to provide a distributed pressure between the various contact areas. The flexible and compressible overlay interconnect 10, in FIG. 2A, also compensates for small thickness variations of the IC chips 16 by compressing itself to deform in a direction normal to the plane of the IC chips 16. The flexible overlay interconnect 10, in FIG. 2, compensates for small thickness variations by being compressed together with the IC chips 16, by the elastomer layer 32.

Any substantial variation in the thickness of the IC chips 16 or other circuit elements, such as a chip capacitor 16A, shown clearly in FIGS. 2A and 2B, which is typically much thicker than the IC chips 16, can be accommodated by locating a cut-out region 36 above the chip capacitor 16A. In addition, many circuit elements such as a high frequency gallium arsenide (GaAs) chip 16B, are designed to work against a medium of air having a dielectric constant of one, as opposed to a typical dielectric value of about three, for polymer materials. Consequently, some circuit elements such as the GaAs chip 16B, require that the cut-out region 36 be aligned with its exposed surface so that the GaAs chip 16B may be in contact with air as opposed to the interconnect material.

The overlay interconnect 10 is particularly useful for testing IC chips 16, even while still in wafer form. If a defective chip is identified in a circuit test, the overlay interconnect 10 can be removed, thereafter the defective chip removed and replaced, and the overlay interconnect 10 replaced, without damage to the other IC chips 16. The overlay interconnect 10 can also be applied to a single chip in a socketable, single chip package for testing and burn-in and then removed. If desired, the contact areas can be bonded together after testing by a conventional bonding technique, such as thermocompression bonding, ultrasonic bonding or laser spot welding.

As illustrated in FIG. 3a, the multilayer overlay interconnect 10 of the present invention is fabricated by applying a metal layer 24', such as copper, aluminum or gold, by sputtering or other conventional vacuum deposition methods onto either a flexible or both flexible and compressible polymer film to form a base layer 12. The flexible polymer film is preferably a polyimide, although a polyester, an aramide fiber, a fluororpolymer, or a polyethermide are also suitable flexible polymers. Examples of flexible polymer films include Kapton, which is a polyimide film, and Kevlar, which is an aramide fiber film. Both flexible polymer films are manufactured by DuPont. The flexible and compressible polymer film is preferably a silicone rubber, such as RTV or other suitable flexible and compressible polymers. Inorganic materials, such as silica or Photoceram, an insulating material manufactured by Dow Corning, may also be used.

As shown in FIG. 3b, conventional photolithographic techniques are then used to pattern and etch the metal layer 24' to form electrically-conductive traces 24. As shown in FIG. 3c, a second polymer layer 12 is then formed on the base polymer layer 12 by spraying or spinning on a liquid polymer. The liquid polymer is preferably a liquid polyimide, such as PI-2611 or PI-2721, both of which are manufactured by DuPont. Other liquid polymers include Benzocyclobutene (BCB) or Polyphenylquinaxaline (PPQ). The technique used to spray or spin on the second polymer layer 12 is the same as that used for forming the photoresist layers.

After the second polymer layer 12 has cured, via holes 38 are opened down through the polymer layer 12 to one or more of the traces 24, as shown in FIG. 3d. The via holes 38 are formed by photolithographic techniques or by laser drilling. As shown in FIG. 3e, a second metal layer 24' is then deposited onto the second polymer layer 12, with the metal filling the via holes 38 to form interconnecting vias 26. As shown in FIG. 3f, the second metal layer 24' is then photolithographically patterned and etched to form additional traces 24. Successive layers are built up by spraying or spinning on additional polymer layers and depositing additional metal layers which are subsequently photolithographically patterned and etched. As many as ten or more layers may be formed, depending on the complexity of the interconnect. The inner contact areas 14 and outer contact areas 18 are then formed along with electrically-conductive traces 24 on the outermost layer 12. Bumps 40, preferably of gold, can be formed on the inner contact areas 14 and outer contact areas 18 to ensure good electrical connections between the various contact areas. In an alternative fabrication method of the present invention, the additional polymer layers 12 are built up by gluing a polymer film to the previous layer rather than by spinning or spraying on a liquid polymer. Preferably thereafter, cut-out regions 36 as shown in FIGS. 2A and 2B, are opened down through the overlay interconnect 10, where required, to accommodate for variations in circuit element thicknesses (such as chip capacitor 16A) or for circuit elements (such as GaAs chip 16B) which require a medium of air to operate properly. The cut-out regions 36 can be formed by layer cutting, mechanical die, chemical etching or other suitable methods.

From the foregoing, it will be appreciated that the present invention represents a significant advance in the field of high-density circuit element packaging. Although several preferred embodiments of the invention have been shown and described, it will be apparent that other adaptations and modifications can be made without departing from the spirit and scope of the invention. Accordingly, the invention is not to be limited, except as by the following claims.

What is claimed is:

1. A multilayer overlay interconnect for removably packaging at least one integrated-circuit (IC) chip in a chip package, comprising:
    a plurality of thin flexible layers of an insulating material;
    a plurality of inner contact areas positioned on an outermost flexible layer for making electrical contact with contact areas on the at least one IC chip;
    a plurality of outer contact areas positioned on the outermost flexible layer for making electrical contact with contact areas on leads extending into the chip package;
    electrically conductive traces positioned on one or more of the flexible layers with interconnecting vias for interconnecting the inner and outer contact areas; and
    an elastomer layer operable to compress the flexible overlay interconnect, wherein the elastomer layer compresses the flexible overlay interconnect together with the at least one IC and the chip package leads to make electricl contact between the contact areas.

2. The multilayer overlay interconnect as set forth in claim 1 wherein the multilayer overlay interconnect defines at least one cut-out region within the overlay interconnect, said cut-out region operable to provide a medium of air to the at least one IC chip.

3. The multilayer overlay interconnect as set forth in claim 1 wherein the electrical contact areas between the at least one IC chip and the inner contact areas are bonded together, and the contact areas between the leads extending into the chip package and the outer contact areas are bonded together.

4. The multilayer overlay interconnect as set forth in claim 1 wherein the at least one IC chip is a plurality of IC chips positioned relative to each other in a coplanar configuration.

5. The multilayer overlay interconnect as set forth in claim 4 wherein the multilayer overlay interconnect defines at least one cut-out region within the overlay interconnect, said cut-out region operable to accommodate for substantial variations in the thicknesses of the plurality of IC chips and/or to provide a medium of air to the at least one IC chip.

6. The multilayer overlay interconnect as set forth in claim 1 wherein the multilayer overlay interconnect further includes a heat sink and/or a substrate interconnect, said heat sink operable to provide heat dissipation for the at least one IC chip, said substrate interconnect operable to provide additional contact areas for the at least one IC chip.

7. The multilayer overlay interconnect as set forth in claim 1 wherein the insulating material is a polymer material.

8. The multilayer overlay interconnect as set forth in claim 7 wherein the polymer material is a polyimide material.

9. The multilayer overlay interconnect as set forth in claim 7 wherein the polymer material is silicone rubber.

10. The multilayer overlay interconnect as set forth in claim 1 wherein the insulating material is an inorganic material.

11. A multilayer overlay interconnect for removably interconnecting at least one circuit element with external contact areas, comprising:
    a plurality of thin flexible layers of an insulating material;
    a plurality of inner contact areas positioned on an outermost flexible layer for making electrical contact with contact areas on the at least one circuit element;
    a plurality of outer contact areas positioned on the outermost flexible layer for making electrical contact with the external contact areas;
    electrically conductive traces positioned on one or more of the layers with interconnecting vias for interconnecting the inner and outer contact areas; and
    an elastomer layer operable to compress the overlay interconnect, wherein the elastomer layer compresses the overlay interconnect together with the at least one circuit element and the external contact areas to make electrical contact between the contact areas.

12. The multilayer overlay interconnect as set forth in claim 11 wherein the multilayer overlay interconnect defines at least one cut-out region within the overlay interconnect, said cut-out region operable to provide a medium of air to the at least one circuit element.

13. The multilayer overlay interconnect as set forth in claim 11 wherein the electrical contact areas between the at least one circuit element and the inner contact areas are bonded together, and the contact areas between the external contact areas and the outer contact areas are bonded together.

14. The multilayer overlay interconnect as set forth in claim 11 wherein the at least one circuit element is a plurality of circuit elements positioned relative to each other in a coplanar configuration, said plurality of circuit elements including at least one integrated circuit (IC) chip.

15. The multilayer overlay interconnect as set forth in claim 14 wherein the multilayer overlay interconnect defines at least one cut-out region within the overlay interconnect, said cut-out region operable to accommodate for substantial variations in the thicknesses of the plurality of circuit elements and/or to provide a medium of air to the at least one circuit element.

16. The multilayer overlay interconnect as set forth in claim 11 wherein the multilayer overlay interconnect further includes a heat sink and/or a substrate interconnect, said heat sink operable to provide heat dissipation for the at least one circuit element, said substrate interconnect operable to provide additional contact areas for the at least one circuit element.

17. The multilayer overlay interconnect as set forth in claim 11 wherein the insulating material is a polymer material.

18. The multilayer overlay interconnect as set forth in claim 17 wherein the polymer material is a polyimide material.

19. The multilayer overlay interconnect as set forth in claim 17 wherein the polymer material is silicone rubber.

20. The multilayer overlay interconnect as set forth in claim 11 wherein the insulating material is an inorganic material.

21. A multilayer overlay interconnect for removably interconnecting at least one circuit element with external contact areas, comprising:
- a plurality of thin flexible and compressible layers of an insulating material;
- a plurality of inner contact areas positioned on an outermost flexible and compressible layer for making electrical contact with contact areas on the at least one circuit element;
- a plurality of outer contact areas positioned on the outermost flexible and compressible layer for making electrical contact with the external contact areas; and
- electrically conductive traces positioned on one or more of the flexible and compressible layers with interconnecting vias for interconnecting the inner and outer contact areas, wherein the compliant overlay interconnect is operable to be compressed to deform itself in a direction normal to the plane of the at least one circuit element and the external contact areas to make electrical contact between the contact areas.

22. The multilayer overlay interconnect as set forth in claim 21 wherein the multilayer overlay interconnect further includes an elastomer layer, said elastomer layer operable to compress the flexible and compressible overlay interconnect together with the at least one circuit element and the external contact areas.

23. The multilayer overlay interconnect as set forth in claim 21 wherein the multilayer overlay interconnect defines at least one cut-out region within the overlay interconnect, said cut-out region operable to provide a medium of air to the at least one circuit element.

24. The multilayer overlay interconnect as set forth in claim 21 wherein the electrical contact areas between the at least one circuit element and the inner contact areas are bonded together, and the contact areas between the external contact areas and the outer contact areas are bonded together.

25. The multilayer overlay interconnect as set forth in claim 21 wherein the at least one circuit element is a plurality of circuit elements positioned relative to each other in a coplanar configuration, said plurality of circuit elements including at least one integrated circuit (IC) chip.

26. The multilayer overlay interconnect as set forth in claim 25 wherein the multilayer overlay interconnect defines at least one cut-out region within the overlay interconnect, said cut-out region operable to accommodate for substantial variations in the thicknesses of the plurality of circuit elements and/or to provide a medium of air to the at least one circuit element.

27. The multilayer overlay interconnect as set forth in claim 21 wherein the multilayer overlay interconnect further includes a heat sink and/or a substrate interconnect, said heat sink operable to provide heat dissipation for the at least one circuit element, said substrate interconnect operable to provide additional contact areas for the at least one circuit element.

28. The multilayer overlay interconnect as set forth in claim 21 wherein the insulating material is a polymer material.

29. The multilayer overlay interconnect as set forth in claim 28 wherein the polymer material is a polyimide material.

30. The multilayer overlay interconnect as set forth in claim 28 wherein the polymer material is silicone rubber.

31. The multilayer overlay interconnect as set forth in claim 21 wherein the insulating material is an inorganic material.

32. A multilayer overlay interconnect for removably interconnecting at least one integrated circuit (IC) chip in a chip package, comprising:
- a plurality of thin flexible and compressible layers of an insulating material;
- a plurality of inner contact areas positioned on an outermost flexible and compressible layer for making electrical contact with contact areas on the at least one IC chip;
- a plurality of outer contact areas positioned on the outermost flexible and compressible layer for making electrical contact with contact areas on leads extending into the chip package;
- electrically conductive traces positioned on one or more of the flexible and compressible layers with interconnecting vias for interconnecting the inner and outer contact areas; and
- at least one cut-out region defined by the overlay interconnect, said cut-out region operable to provide a medium of air to the at least one IC chip, wherein the flexible and compressible overlay interconnect is operable to be compressed to deform itself in a direction normal to the plane of the at least one IC chip and the chip package leads to make electrical contact between the contact areas.

* * * * *